United States Patent
Stern et al.

(10) Patent No.: US 6,713,670 B2
(45) Date of Patent: Mar. 30, 2004

(54) ELECTROSTATICALLY CLEAN SOLAR ARRAY

(75) Inventors: Theodore Garry Stern, El Cajon, CA (US); Duane Eric Krumweide, Del Mar, CA (US)

(73) Assignee: Composite Optics, Incorporated, San Diego, CA (US)

( * ) Notice: Subject to any disclaimer, the term of this patent is extended or adjusted under 35 U.S.C. 154(b) by 0 days.

(21) Appl. No.: 10/219,849

(22) Filed: Aug. 14, 2002

(65) Prior Publication Data

US 2003/0034062 A1 Feb. 20, 2003

Related U.S. Application Data

(60) Provisional application No. 60/313,414, filed on Aug. 17, 2001.

(51) Int. Cl.[7] .................... H01L 31/048; H01L 31/05
(52) U.S. Cl. ................ 136/251; 136/244; 136/292; 136/293; 438/64; 438/66; 438/80; 244/173; 361/217; 361/218
(58) Field of Search ................. 136/251, 244, 136/292, 293; 438/64, 66, 80; 244/173; 361/217, 218

(56) References Cited

U.S. PATENT DOCUMENTS

| | | |
|---|---|---|
| 4,348,546 A | 9/1982 | Little |
| 4,433,201 A | 2/1984 | Fellas |
| 4,832,755 A | 5/1989 | Barton et al. |
| 4,849,028 A | 7/1989 | Krause |
| 5,542,988 A | 8/1996 | Bogus |
| 5,919,316 A | 7/1999 | Bogorad et al. |
| 6,091,017 A * | 7/2000 | Stern .................... 136/246 |
| 6,156,967 A | 12/2000 | Ralph et al. |
| 6,177,629 B1 * | 1/2001 | Katz .................... 136/292 |
| 6,194,651 B1 | 2/2001 | Stark et al. |
| 6,243,243 B1 | 6/2001 | Gelderloos et al. |
| 6,260,808 B1 | 7/2001 | Bodeau et al. |

OTHER PUBLICATIONS

Stern et al, "Development of an Electrostatically Clean Solar Array Panel," Conference Record of the 28th Photovoltaic Specialists Conference, Anchorage, AK, Sep. 2000.*

Stern, T., Krumweide, D., Gaddy, E. and Katz, I., "Development of an Electrostatically Clean Solar Array Panel," Proceedings of the 28th IEEE Photovoltaic Specialists Conference, Anchorage, AK, Sep. 2000.

* cited by examiner

Primary Examiner—Alan Diamond
(74) Attorney, Agent, or Firm—Michael Blaine Brooks, P.C.; Michael Blaine Brooks

(57) ABSTRACT

Provided are methods of manufacturing an electrostatically clean solar array panel and the products resulting from the practice of these methods. The preferred method uses an array of solar cells, each with a coverglass where the method includes machining apertures into a flat, electrically conductive sheet so that each aperture is aligned with and undersized with respect to its matched coverglass sheet and thereby fashion a front side shield with apertures (FSA). The undersized portion about each aperture of the bottom side of the FSA shield is bonded to the topside portions nearest the edges of each aperture's matched coverglass. Edge clips are attached to the front side aperture shield edges with the edge clips electrically and mechanically connecting the tops of the coverglasses to the solar panel substrate. The FSA shield, edge clips and substrate edges are bonded so as to produce a conductively grounded electrostatically clean solar array panel.

36 Claims, 6 Drawing Sheets

ELECTROSTATICALLY CLEAN SOLAR ARRAY

CROSS-REFERENCE TO RELATED APPLICATION

This application claims benefit of the following U.S. Provisional Patent Application, the disclosure of which, including all appendices and all attached documents, is hereby incorporated by reference herein, in its entirety for all purposes: U.S. Provisional Patent Application Ser. No. 60/313,414, to Theodore Garry Stern and Duane Eric Krumweide entitled, "ELECTROSTATICALLY CLEAN SOLAR ARRAY," filed Aug. 17, 2001.

FEDERALLY SPONSORED RESEARCH

The invention was made with Government support under NAS5-99236 awarded by the National Aeronautics and Space Administration (NASA). The Government has certain rights in the invention.

BACKGROUND

1. Field of the Invention

This invention relates to solar array panels and their manufacture and more particularly to electrostatically clean solar array (ECSA) panels and their manufacture.

BACKGROUND

2. Description of Prior Art

Certain space missions need solar arrays that do not affect the electromagnetic environment to allow for the uncorrupted operation of sensitive instruments. Solar arrays with exposed conductors both introduce and absorb current from the surrounding environment, and affect the shape of the plasma sheath that typically surrounds a solar array in earth orbit. Presently, solar arrays typically have electrical circuitry exposed to the extent that it interacts with the ambient plasma. This interaction affects the floating potential and particle trajectories surrounding the spacecraft, and in doing so the affected floating potential and particle trajectories may be sufficient in strength to influence scientific or otherwise sensitive mission readings.

The exposed circuitry of a solar array comprises primarily the solar cell interconnects and cell edges, although cell string terminations, panel diodes and terminal boards can also provide sites for electromagnetic field interactions. Typical solar cell arrays use individual cell-coverglass assemblies that have spacing between the cell-coverglass assemblies for electrical and thermomechanical reasons. Conventional solar panels use conductive-coated solar cell cover glasses. A typical coating material used conductive coating is Indium-Tin-Oxide (ITO). If the coverglasses use a conductive coating, the coverglasses must be electrically connected to each other and to the array structure to establish a ground plane. Even so, spacing between the coverglasses expose interconnects that interact with the ambient environment. For a typical solar panel, a large number of these exposed inter-cell and edge regions exist producing a collectively significant exposed area principally due to the relatively small size of cell-coverglass assemblies.

An electrostatically clean solar panel needs a method and means for covering these inter-cell and edge areas so as to create a contiguous ground plane on the front side and edges of the panel. Since electrical conductivity is already achieved on the array backside, a method and means for covering these inter-cell and edge areas is needed so as to create a contiguous ground plane on the front side and edges of the panel and thereby enable the panel that surrounds the solar cells to provide a grounded shield. Reliable electrical continuity of the grounded shield and insulation of the shield from the photovoltaic electrical circuit is critical. Accordingly, the method and means for covering these inter-cell and edge areas so as to create a contiguous ground plane on the front side and edges of the panel needs to minimize thermal mismatch stresses, use materials and processes that are qualified by similarity to existing techniques applied to solar panels, and minimize cost and complexity.

SUMMARY

Embodiments of the present invention are disclosed including a preferred method of manufacturing an electrostatically clean solar array panel that includes a substrate having a perimeter surface and an array of solar cells, each with substantially rectangular cover glass sheets where the method includes the steps of first machining several substantially rectangular apertures into a flat, electrically conductive sheet with each aperture aligned with and undersized with respect to its matched coverglass sheet. The machined electrically conductive sheet, also termed a front side aperture shield and a frontside shield with apertures, is fabricated. The second step includes bonding the undersized portion about each aperture of the bottom side of the front side aperture shield to the top Bide portions nearest the edges of each aperture's matched coverglass. The third step includes attaching a several edge clips to the front side aperture shield edges with the edge clips electrically and mechanically connecting the tops of the coverglasses to the perimeter surface solar panel substrate. The fourth step includes attaching the front side aperture shield, edge clips and substrate edges so as to produce a conductively grounded electrostatically clean solar array panel. Accordingly, a product by this disclosed process is an electrostatically clean solar array panel that includes a solar array panel having a perimeter surface and coverglasses, a front-side aperture shield of electrically conductive material, and edge clips mechanically and electrically connecting the coverglasses of said solar array to the solar panel perimeter substrate surface, whereby active power circuitry of the solar panel array is electromagnetically isolated.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DETAILED DESCRIPTION OF THE PREFERRED EMBODIMENTS

The several embodiments of the present invention provide an equipotential surface on the front side of a conventional solar panel, grounding the panel to both its backside and the remaining panel structure and prevent or substantially preclude the exposure of solar array active electrical components to the external environmment. An aspect of an embodiment of the present invention is a modification to a conventional solar panel whereby the modification covers the spaces between solar cells and provdes cover around the edges of the panel with an electrically conductive material. The modification works to mechanically and electrically connect the electrically conductive material of the covering to the conductive-coated solar cell coverglasses typically present on solar panels.

Because the several embodiments of the present invention provide an equipotential surface on the front side of a conventional solar panel and grounds the front side of the solar panel to the backside of the panel and the remaining panel structure, the embodiment of the present invention shields the environment surrounding the solar cells from the solar panel active power generation circuits and thereby prevents or substantially minimizes the leakage of electrostatic fields into the environment surrounding the solar cells comprsing the panel. The several embodiments of the present invention also eliminate exposure of solar panel insulating surfaces to the space environment.

Figure 1:
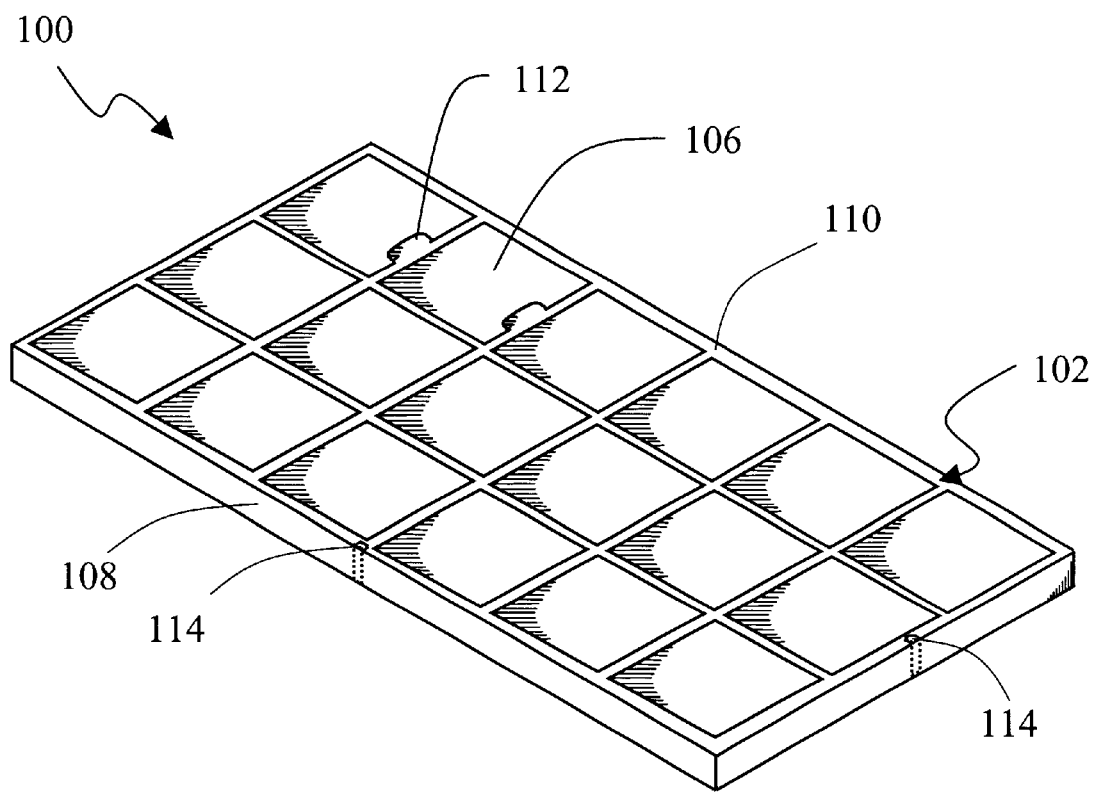
FIG. 1 is a perspective view illustrating a basic geometry of an ECSA Panel Using a FSA Shield.

In a preferred embodiment of the invention illustrated in FIG. 1, an electrostatically clean solar panel 100 uses a Frontside Aperture-Shield (FSA) 102 that covers a multitude of inter-cell areas with a single graphite composite laminate 110, composite edge clips 114 for connecting the FSA to the panel substrate (not shown), edge sheilds 108, built-in tabs 112 that interconnect the FSA to conductive coated coverglasses 106 using a conductive adhesive. Alternative material for the FSA include other space-qualified laminates and sheet metal. Alternative conductive connections for making the electrical connections include solder or wire bonding.

Fabricating an ECSA panel 100 preferrably involves cutting the FSA 102 out of a single piece of material. This fabricating approach is a significant improvement over alternative methods that piece together individual conductive strips covering each of the thousands of intercell spacings.

The shielding components that are added to a conventional solar panel to create the electrostatically clean panel 100 include the front-side aperture 102 and the edge clips 114. The edge clips 114 also improve the grounding performance of a solar array by providing a direct ground path from the conductively coated coverglasss 106 to the panel substrate.

The solar panel is in effect packaged by the methods of the present invention in a grounded and shielded enclosure that provides total electromagnetic isolation of the solar panel's active power circuitry and establishes an equipotential surface on the solar panel.

Figure 2:
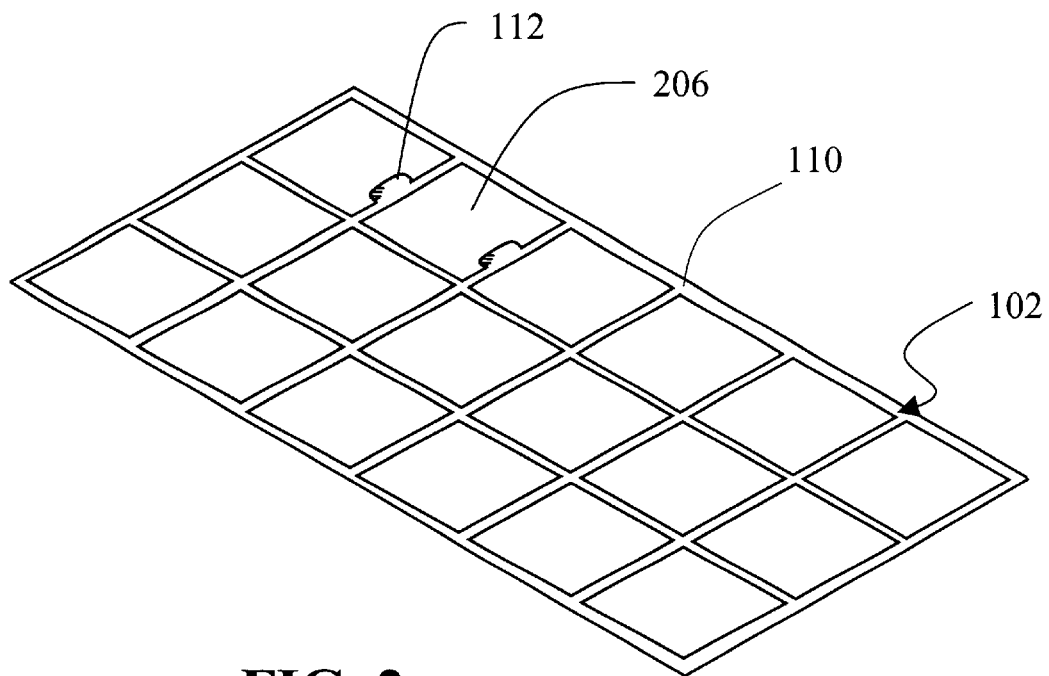
FIG. 2 is a perspective view of an FSA.

A preferred principal component of the FSA 102 is illustrated in FIG. 2 and is a flat laminate of graphite fiber reinforced composite, such as a two-ply or molded laminate of T300/RS-3 fabric, that is cured into a rigid sheet 110.

Alternatively, any graphite laminated composite could be used in the methods disclosed. The FSA apertures 206, which correspond to approximately to the dimensions of the planar footprint of solar cell coverglasses 106, are machined using waterjet, pin-routing or similar conventional machining technology or other conventional machining techniques, with one aperture 206 per solar cell coverglass 106. In its several embodiments, the coverglass can cover one or more solar cells.

Figure 3:
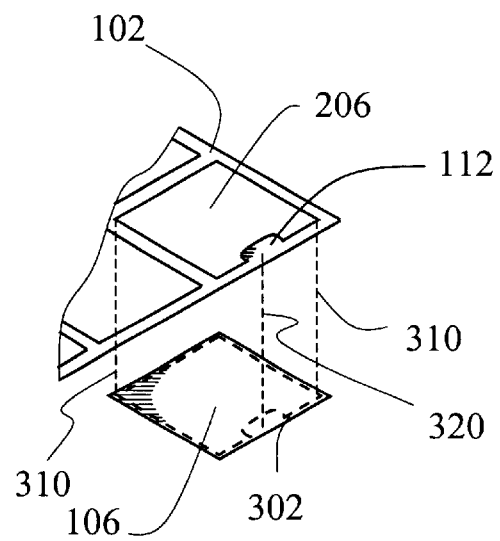
FIG. 3 is a perspective view of an aperture of the FSA relative to its corresponding coverglass before bonding.
Figure 4:
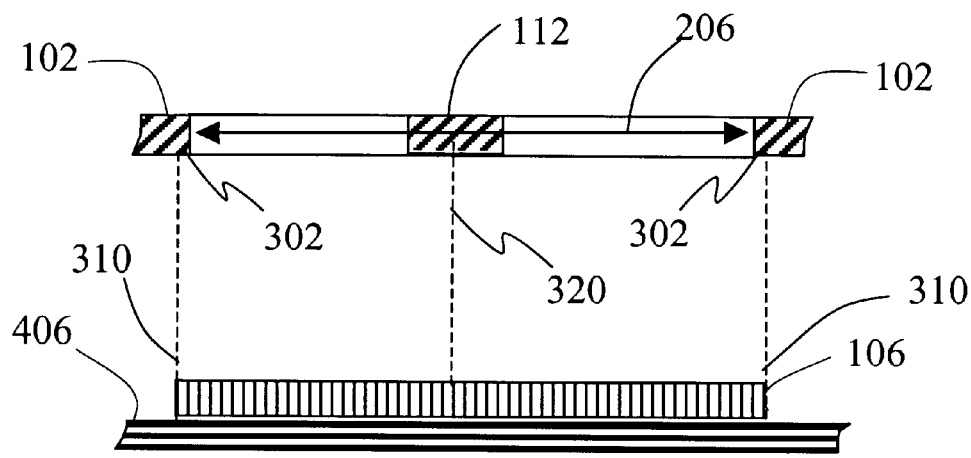
FIG. 4 is a transverse view of an aperture of the FSA relative to its corresponding coverglass before bonding.

FIG. 3 illustrates in a perspective view that in the preferred embodiment, the apertures 206 are undersized by a small amount 302 (about 0.030 incges along each of the four edges), so that an overlap 302 between the FSA 102 and the coverglass 106 permits the application of an adhesive bond. The bond between the FSA 102 and the coverglasses 106 can then be made using silicone or other adhesive 310. As part of the aperture machining, tabs 112 of the laminate are left protruding into the aperture. These tabs 112 provide a stress-relieved interconnection to the coverglasses 106. These tabs 112 are bonded to the coverglasses 106 preferrably using an electrically conductive adhesive, such as silver-filled silicone 320. Alternative electrically conductive adhesives include conductive silicones or epoxies filled with graphite/carbon, aluminum, copper, gold, and nickel-filled or combinations thereof. FIG. 4 provides a tranverse cut view across the panel substrate 406 and an individual coverglass 106 and with the coverglass's corresponding aperture 206 of the FSA 110 aligned with the modest overlap 302 for bonding 310. The tab 112 for the particular aperature 206 is shown in tranverse cut and oriented for bonding 320.

Figure 5A:
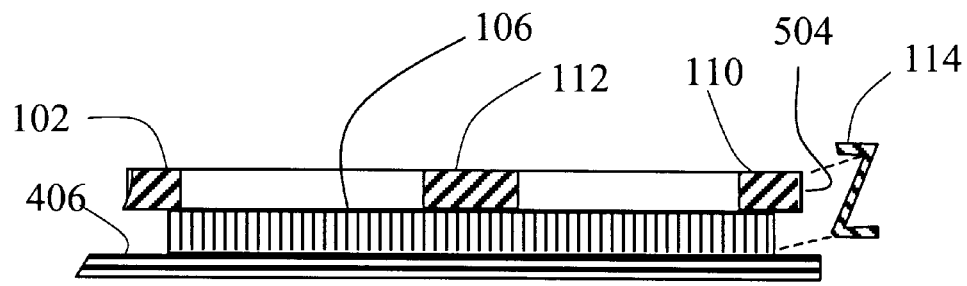
FIG. 5A is a transverse view of an aperture of the FSA boded to the coverglass showing prospective attachment of an edge clip.
Figure 5B:
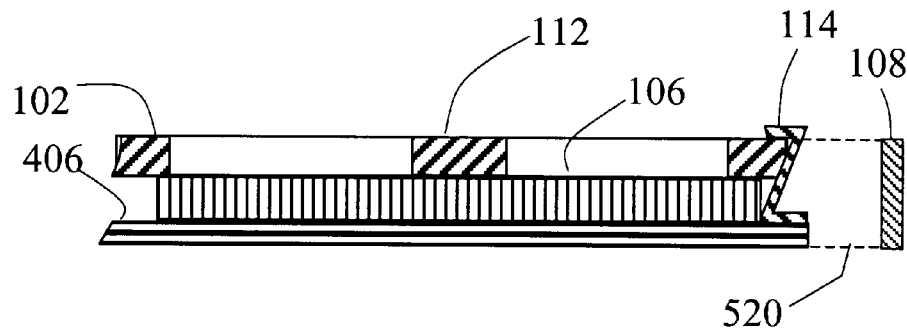
FIG. 5B is a transverse view of an aperture of the FSA boded to the coverglass showing attachment of an edge clip.

FIG. 5A illustrates an application of one of a plurality of edge clips 114, which are strips fabricated from the same composite material on a Z-shaped mandrel or similarly shaped mandrel, that are bonded to the edges 504 of the FSA 102, and bridge the gap between the top of the FSA and the solar panel substrate 406 thereby covering the edges of the coverglasses 106 and the solar cells. While shown in this example as having a preferred transverse z-shape, the edge clip shape is generally required to be comprised of at least two substantially horizontal surfaces and one subtantially vertical surface. Additional conductive adhesive is used to connect the FSA 102 and the edge clips 114 and the substrate 406 edges to completely ground all components that are not part of the electrical power generation circuit with an assembled subsection illustrated in FIG. 5B. Preferrably, edge covers made of the same laminate material can then be applied 520 to the substrate edges.

Figure 6:
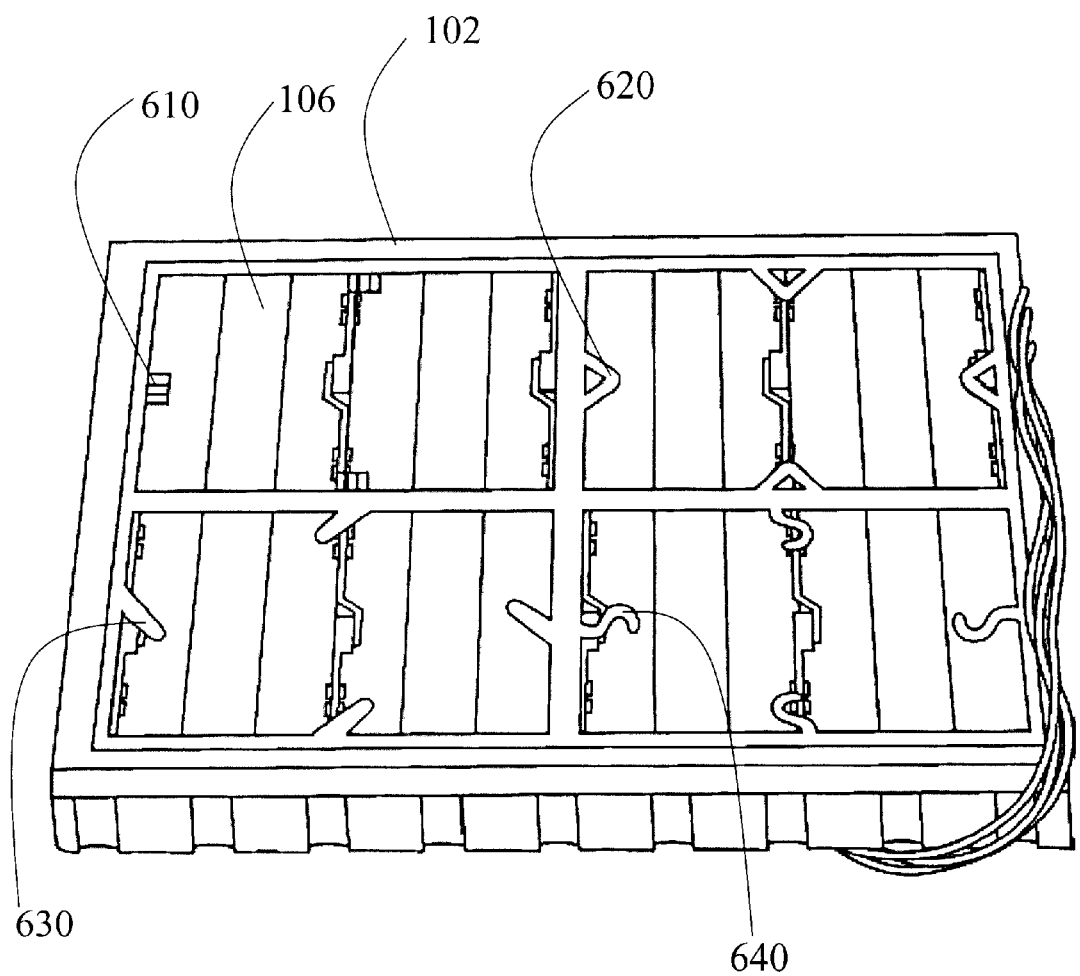
FIG. 6 is a perspective view of a qualification coupon using coverglass interconnect embodiments.

FIG. 6 illustrates four of the several embodiments of the converglass interconnections in a prototypical array using a tab. A first embodiment uses a FSA bonded to the coverglass with a conductive adhesive, but without a tab 610 that is bonded to its coverglass 106. A second embodiment, the preferred tab embodiment, is illustrated with a triangular-shaped extension as a tab 620. A third embodiment is illustrated with a slanted linear extension as a tab 630. A fourth embodiment is illustrated with a hook-shaped extension as a tab 640.

Figure 7A:
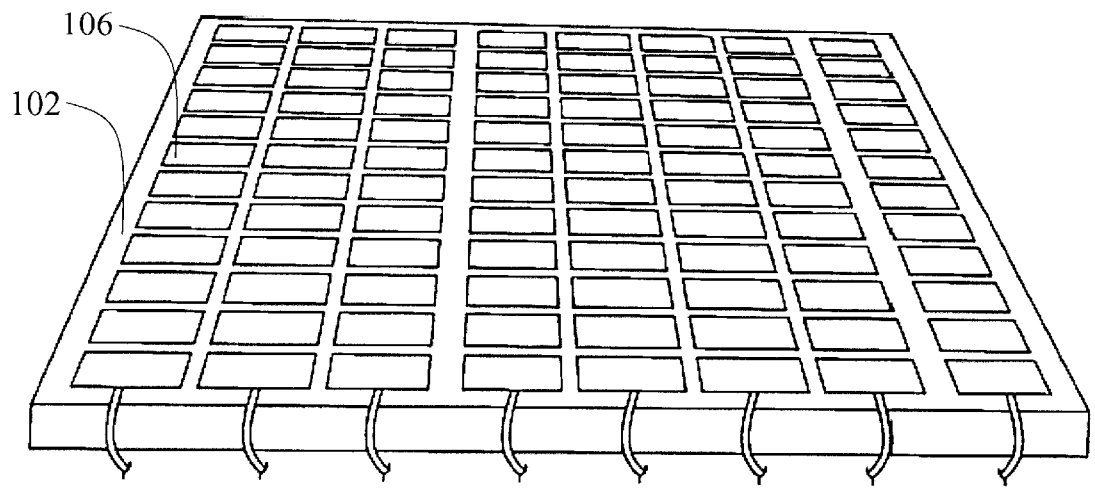
FIG. 7A is a perspective view of a ECSA panel.
Figure 7B:
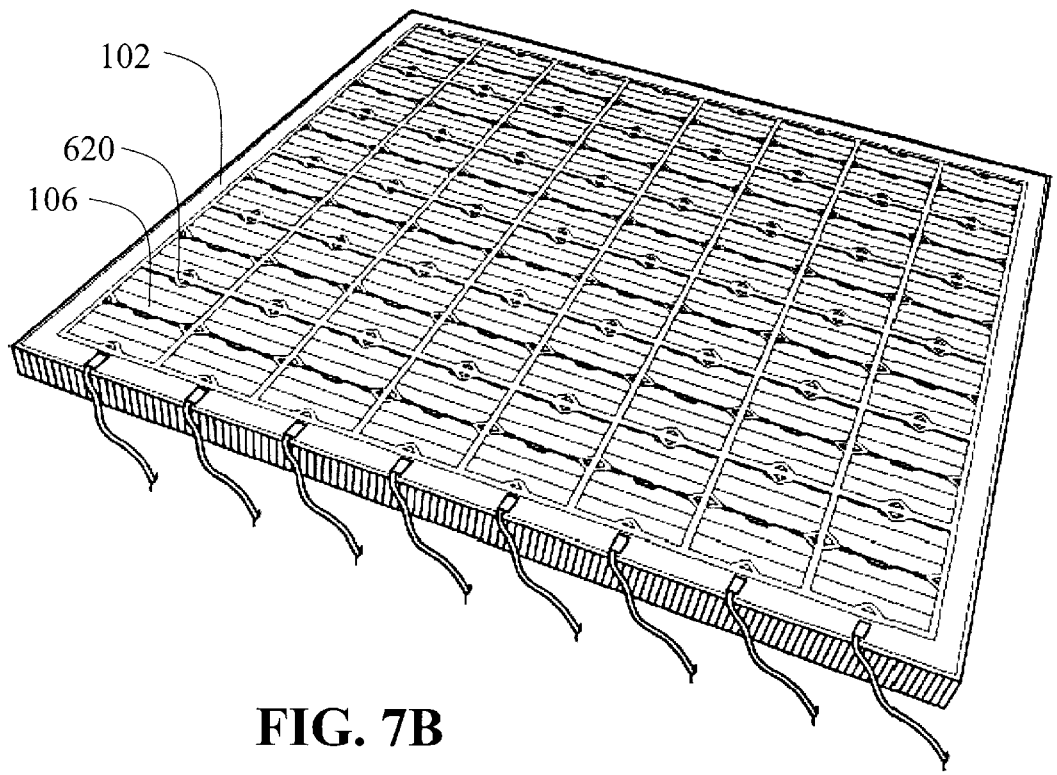
FIG. 7B is a perspective view of a ECSA panel.

FIG. 7A illustrates a side perspective view of an ECSA panel relying on conductive adhesive bonding without tabs. FIG. 7B illustrates a perspective view of an example of an ECSA panel using the preferred triangle-shaped tabs 620.

Figure 8:
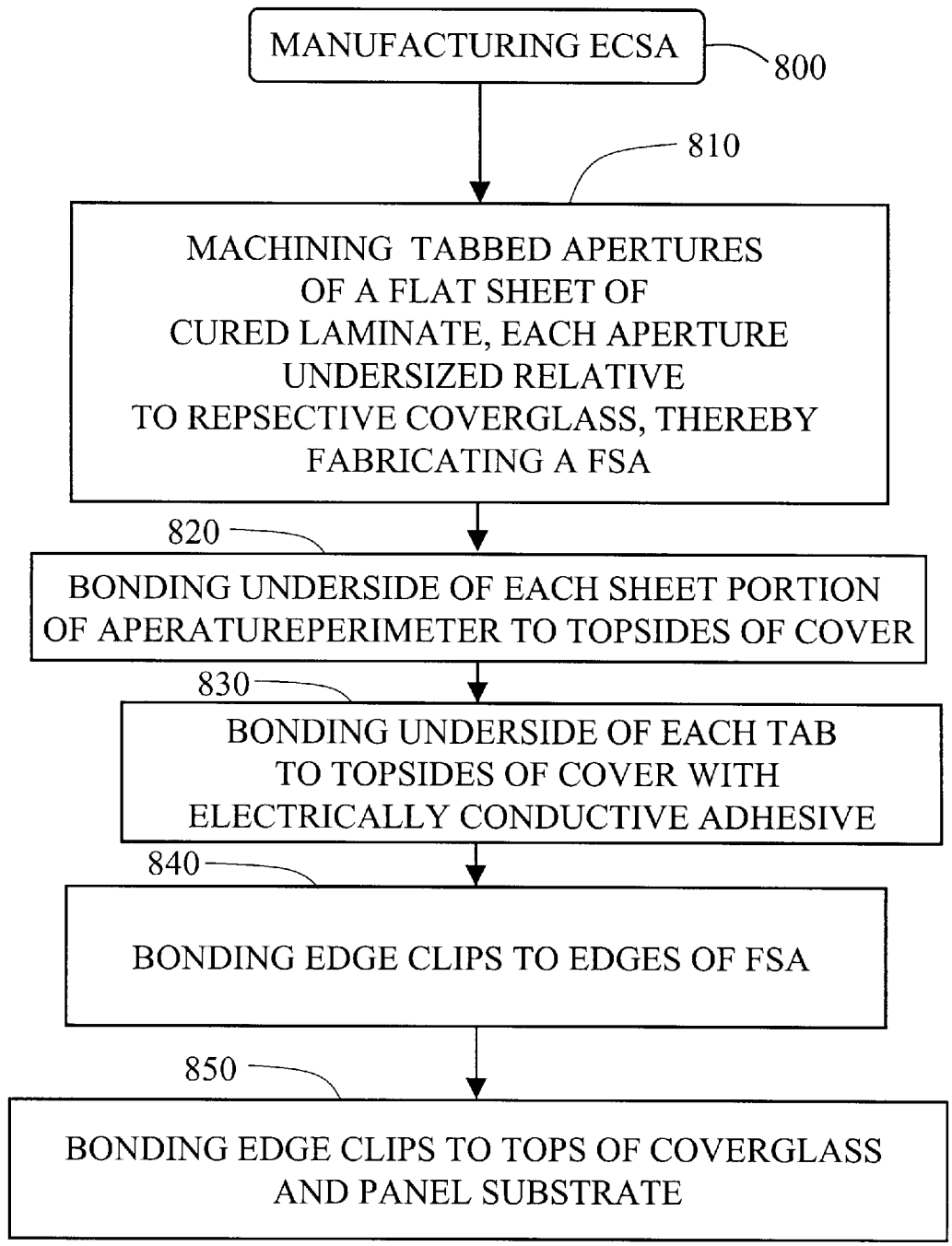
FIG. 8 is a flowchart illustrating the preferred method of manufacturing the ECSA.

The preferred method of manufacture of the present invention is illustrated in FIG. 8. Manufacturing an ECSA 800 begins with machining a plurality of substantially rectangular apertures into a flat sheet of cured laminate of graphite-fiber-reinforced composite with a perimeter of four edges with each aperture machined from the flat sheet so that each of the four edges of its substantially rectangular perimeter are undersized relative to the perimeter of its matched coverglass 810. The coverglass 106 is of a conventional construction that includes transparent conductive coating such as ITO. In addition, each aperture perimeter is machined from the sheet to provide one or more tabs protruding or otherwise extending into the principal plane formed by its respective aperture 810. The undersized portion surrounding each aperture allows for a bonding surface where adhesive is applied to the bottom side of the front side aperture shield and to the top side portions nearest the edges of the particular aperture's matched coverglass 820. The bottom of each tab is bonded to the topside of the matched coverglass with electrically conductive adhesive 830. Four edge clips are bonded to the front side aperture shield edges in a fashion that the edge clips electrically and mechanically connect either the tops of the coverglasses, or the front-side shield edges, or both, to the perimeter surface solar panel substrate 840. The front side aperture shield, edge clips and substrate edges are bonded so as to produce a conductively grounded electrostatically clean solar array panel 850.

The benefits provided by the several embodiments of the present invention and related methods of manaufacture are that they work to prevent electrical interference of the solar panel with the measurement capability of sensitive instruments on the spacecraft, and also prevents problems associated with exposure of solar cell interconnects and other active circuitry, as well as insulating material, to the space environment.

The several embodiments of the present invention are useable whenever sensitive instruments are flown on a spacecraft that need clean environments for their function. The several embodiments of the present invention have further application whenever differential charging is a concern for solar panels due to ram currents of electrons and/or protons which are present in the space plasma, or photoemission from the front side of the solar array. The several embodiments of the present invention also have application as shield embodiments whenever natural or man-made environments might present a hazard to solar cell interconnects or exposed wiring, such as dense plasma environments, or environments resulting from ion propulsion thrusters.

Although the description of the invention here is the baseline that has been demonstrated, other embodiments of the key components are readily apparent based upon the present disclosure. Alternatives embodiments of key components include the use of alternative electrically conductive materials instead of a graphite composite laminate, such as a metal sheet or other molded or laminated electrically conductive composite material for the FSA, the use of alternative conductive connections such as other conductive adhesive or pads, springed metal tabs, solder or wire bonding, instead of conductive adhesives, including the preferred silver-filled silicone conductive adhesive, for making the electrical connections. Also, the electrical connection of the FSA directly to the cover glass, instead of through the built-in tabs is an alternative embodiment.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A method of manufacturing an electrostatically clean solar array panel comprised of a substrate having a perimeter surface and edges and an array of solar cells each with substantially rectangular coverglass; the coverglasses having a top side, a bottom side, and a perimeter of four edges, the method comprising the steps of:

machining a plurality of substantially rectangular apertures within a flat, electrically conductive sheet, with each aperture having a perimeter of four edges; the flat sheet having a topside, a bottom side, and four edges; each aperture aligned with a uniquely matched coverglass; each aperture machined from the flat sheet so that each of the four edges of its substantially rectangular perimeter are undersized relative to the perimeter of its matched coverglass; whereby a front-side shield with apertures is fabricated from the flat sheet;

fixedly attaching the undersized portion about each aperture of the bottom side of the front-side shield with apertures to the top side portions nearest the edges of its matched coverglass;

fixedly attaching a plurality of edge clips to the front-side aperture shield edges; the edge clips electrically and mechanically connecting the front-side shield with apertures to the perimeter surface of the substrate; and fixedly attaching the front-side aperture shield, edge clips and substrate edges so as to produce a conductively grounded electrostatically clean solar array panel.

2. The method as claimed in claim 1 wherein each aperture perimeter of the step of machining a plurality of rectangular apertures of a flat, electrically conductive sheet is machined to provide one or more tabs protruding into a plane formed by its respective aperture.

3. The method as claimed in claim 2 further including the step of fixedly attaching the tabs to the top side of the matched coverglass with electrically conductive adhesive.

4. The method as claimed in claim 3 wherein the electrically conductive adhesive is selected from the group consisting of conductive silver-filled silicone, conductive graphite/carbon-filled silicone, conductive aluminum-filled silicone, conductive copper-filled silicone, conductive gold-filled silicone, and conductive nickel-filled silicone.

5. The method as claimed in claim 3 wherein the electrically conductive adhesive is selected from the group consisting of conductive silver-filled epoxy, conductive graphite/carbon-filled epoxy, conductive aluminum-filled epoxy, conductive copper-filled epoxy, conductive gold-filled epoxy, and conductive nickel-filled epoxy.

6. The method as claimed in claim 1 wherein the flat, electrically conductive, sheet is cured laminate of graphite-fiber-reinforced composite.

7. The method as claimed in claim 6 wherein the step of machining a plurality of rectangular apertures within a flat electrically conductive sheet is done with a waterjet.

8. The method as claimed in claim 6 wherein the step of machining a plurality of rectangular apertures within a flat electrically conductive sheet is done with a pin-router.

9. The method as claimed in claim 1 wherein at least one edge clip is electrically and mechanically connecting the tops of the coverglass to the perimeter surface of the substrate.

10. The method as claimed in claim 1 wherein the flat, electrically conductive, sheet is a metallic sheet.

11. The method as claimed in claim 1 wherein the step of fixedly attaching the undersized portion about each aperture of the machined sheet to its matched coverglass uses adhesive bonding.

12. The method as claimed in claim 1 wherein the step of fixedly attaching the undersized portion about each aperture of the machined sheet to its matched coverglass uses silicone adhesive bonding.

13. The method as claimed in claim 1 wherein the edge clips are comprised of cured laminate of graphite-fiber-reinforced composite.

14. The method as claimed in claim 1 wherein the step of fixedly attaching the front-side aperture shield, edge clips and substrate edges is bonding with a conductive adhesive.

15. The method as claimed in claim 14 wherein the step of fixedly attaching the front-side aperture shield, edge clips and substrate edges is bonding wherein the conductive adhesive is selected from the group consisting of conductive silver-filled silicone, conductive graphite/carbon-filled silicone, conductive aluminum-filled silicone, conductive copper-filled silicone, conductive gold-filled silicone, and conductive nickel-filled silicone.

16. The method as claimed in claim 14 wherein the step of fixedly attaching the front-side aperture shield, edge clips and substrate edges is bonding wherein the conductive adhesive is selected from the group consisting of conductive silver-filled epoxy, conductive graphite/carbon-filled epoxy, conductive aluminum-filled epoxy, conductive copper-filled epoxy, conductive gold-filled epoxy, and conductive nickel-filled epoxy.

17. The method as claimed in claim 1 wherein the step of fixedly attaching the front-side aperture shield, edge clips and substrate edges is soldering.

18. The method as claimed in claim 1 wherein the step of fixedly attaching the front-side aperture shield, edge clips and substrate edges is wirebonding.

19. The method as claimed in claim 1 further including the step of electrically and mechanically connecting the front side aperture shield to each coverglass.

20. An electrostatically clean solar array panel manufactured by the method as claimed in claim 3.

21. An electrostatically clean solar array panel comprising:
a solar array panel having a perimeter surface and coverglasses;
a front-side shield with apertures and made of electrically conductive material; and
edge clips mechanically and electrically connecting the front-side shield with apertures to a perimeter surface of a substrate of the solar panel;
whereby active power circuitry of the solar panel array is electromagnetically isolated.

22. The electrostatically clean solar array panel as claimed in claim 21 wherein the solar array panel is comprised of at least four substrate edges, an array of solar cells, and a plurality of solar panel coverglasses each coverglass having a top side, a bottom side and four edges, and a transparent conductive coating on the top side.

23. The electrostatically clean solar array panel as claimed in claim 21 wherein the front-side aperture shield of electrically conductive material is comprised of a cured flat laminate rectangular sheet of graphite-fiber-reinforced composite with a top side, a bottom side and four edges and with a plurality of substantially rectangular apertures.

24. The electrostatically clean solar array panel as claimed in claim 21 wherein a plurality of apertures of the front-side aperture shield are each aligned with a plurality of coverglasses of the solar array panel so as to produce a one-to-one correspondence of aperture and coverglass, with each aperture being undersized relative to its corresponding coverglass.

25. The electrostatically clean solar array panel as claimed in claim 24 wherein each aperture has at least one tab protruding into the plane of aperture.

26. The electrostatically clean solar array panel as claimed in claim 25 wherein the tab portion of the bottom side of the front-side aperture shield is fixedly attached and in electrical communication with corresponding coverglass.

27. The electrostatically clean solar array panel as claimed in claim 24 wherein the undersized portion of the bottom side of the front-side aperture shield about each aperture is fixedly attached to its corresponding coverglass.

28. The electrostatically clean solar array panel as claimed in claim 24 wherein the front-side aperture shield is fixedly attached and in electrical communication with corresponding coverglass.

29. The electrostatically clean solar array panel as claimed in claim 22 wherein at least one edge clip mechanically and electrically connects the top sides of the coverglasses of the solar array panel to the perimeter surface of the substrate.

30. The electrostatically clean solar array panel as claimed in claim 21 wherein the front-side aperture shield of electrically conductive material is a metallic sheet with a top side, a bottom side and four edges and with a plurality of substantially rectangular apertures.

31. The electrostatically clean solar array panel as claimed in claim 21 wherein the electrical connection is provided by a conductive adhesive.

32. The electrostatically clean solar array panel as claimed in claim 31 wherein the conductive adhesive is selected from the group consisting of conductive silver-filled silicone, conductive graphite/carbon-filled silicone, conductive aluminum-filled silicone, conductive copper-filled silicone, conductive gold-filled silicone, and conductive nickel-filled silicone.

33. The electrostatically clean solar array panel as claimed in claim 31 wherein the conductive adhesive is selected from the group consisting of conductive silver-filled epoxy, conductive graphite/carbon-filled epoxy, conductive aluminum-filled epoxy, conductive copper-filled epoxy, conductive gold-filled epoxy, and conductive nickel-filled epoxy.

34. The electrostatically clean solar array panel as claimed in claim 21 wherein the electrical connection is solder.

35. The electrostatically clean solar array panel as claimed in claim 21 wherein the electrical connection is wirebonding.

36. An electrostatically clean solar array panel comprising:

a solar array panel comprised of a substrate having a perimeter surface and at least four edges, an array of solar cells, and a plurality of solar panel coverglasses, each coverglass having a top side, a bottom side and four edges, and a transparent conductive coating on the top side;

a front-side aperture shield comprised of a cured flat laminate sheet of graphite-fiber-reinforced composite with a top side, a bottom side and four edges and with a plurality of substantially rectangular apertures wherein a plurality of apertures of the front-side aperture shield are each aligned with a plurality of coverglasses of the solar array panel so as to produce a one-to-one correspondence of aperture and coverglass, with each aperture being undersized relative to its corresponding coverglass and each aperture having at least one tab protruding into the plane of aperture wherein the undersized portion of the bottom side of the front-side aperture shield about each aperture is fixedly attached to its corresponding coverglass and wherein the tab portion of the bottom side of the front-side aperture shield is fixedly attached and in electrical continuity with its corresponding coverglass and at least one edge clip mechanically and electrically connecting at least one coverglass of said solar array panel and the frontside shield with apertures to the perimeter surface of the substrate;

whereby active power circuitry of the solar array panel is electromagnetically isolated.

\* \* \* \* \*

UNITED STATES PATENT AND TRADEMARK OFFICE
CERTIFICATE OF CORRECTION

PATENT NO.   : 6,713,670 B2
DATED        : March 30, 2004
INVENTOR(S)  : Theodore Garry Stern and Duane Eric Krumweide It is certified that error appears in the above-identified patent and that said Letters Patent is hereby corrected as shown below:

Column 3,
Line 17, "...the spaces between solar cells and provdes cover around the..." should read
-- ...the spaces between solar cells and provides cover around the... --
Line 32, "...comprsing the panel. The several embodiments of the..." should read
-- ...comprising the panel. The several embodiments of the... --

Column 4,
Line 12, "...small amount 302 (about 0.030 incges along each of the four..." should read
-- ...small amount 302 (about 0.030 inches along each of the four... --

Signed and Sealed this

Seventh Day of September, 2004

JON W. DUDAS
*Director of the United States Patent and Trademark Office*